United States Patent [19]
Trimberger

[11] Patent Number: 6,084,429
[45] Date of Patent: Jul. 4, 2000

[54] PLD HAVING A WINDOW PANE ARCHITECTURE WITH SEGMENTED AND STAGGERED INTERCONNECT WIRING BETWEEN LOGIC BLOCK ARRAYS

[75] Inventor: Stephen M. Trimberger, San Jose, Calif.

[73] Assignee: Xilinx, Inc., San Jose, Calif.

[21] Appl. No.: 09/066,076

[22] Filed: Apr. 24, 1998

[51] Int. Cl.[7] ................................. H03K 19/177
[52] U.S. Cl. ............................... 326/41; 326/39
[58] Field of Search ..................... 326/37, 39, 41, 326/47, 101

[56] References Cited

U.S. PATENT DOCUMENTS

| | | |
|---|---|---|
| Re. 34,363 | 8/1993 | Freeman . |
| 4,758,745 | 7/1988 | Elgamal et al. ........................... 326/41 |
| 4,835,418 | 5/1989 | Hsieh . |
| 5,073,729 | 12/1991 | Green et al. . |
| 5,367,209 | 11/1994 | Hauck et al. ............................. 326/41 |
| 5,455,525 | 10/1995 | Ho et al. . |
| 5,469,078 | 11/1995 | Harward .................................... 326/41 |
| 5,592,106 | 1/1997 | Leong et al. .............................. 326/41 |
| 5,682,107 | 10/1997 | Tavana et al. ............................ 326/41 |
| 5,689,195 | 11/1997 | Cliff et al. ................................ 326/41 |
| 5,880,598 | 3/1999 | Duong ....................................... 326/39 |

OTHER PUBLICATIONS

"The Programmable Logic Data Book", copyright 1998, available from Xilinx, Inc. at 2100 Logic Drive, San Jose, California 95124, pp. 4–225 to 4–241.

"More FPGAS" by W. R. Moore & Luk (eds.), Article by Malkit S. Jhitta, "Introduction of a New FPGA Architecture", 1994, published by Abingdon EE&CS Books, 49 Five Mile Drive, Oxford OX2 8HR, UK, pp 13–23.

*Primary Examiner*—Jon Santamauro
*Attorney, Agent, or Firm*—Adam H. Tachner; Jeanette S. Harms

[57] ABSTRACT

A window pane architecture for FPGAs utilizes spaced subarrays having routing channels therebetween. In one embodiment, at least one routing channel includes segmented and staggered routing wires to minimize current loading and capacitive time delay. Connections between the configurable logic blocks, interconnect, and routing wires may be accomplished with switch matrices and programmable interconnect points.

10 Claims, 7 Drawing Sheets

PLD HAVING A WINDOW PANE ARCHITECTURE WITH SEGMENTED AND STAGGERED INTERCONNECT WIRING BETWEEN LOGIC BLOCK ARRAYS

BACKGROUND OF THE INVENTION

1. Field of the Invention

The present invention relates generally to programmable logic devices (PLDs) and more particularly to improved routing in PLDs having subarrays of configurable logic block tiles.

2. Related Art

Field programmable gate arrays (FPGAs) are well known in the art of PLDs. An FPGA typically includes an array of configurable logic blocks (CLBs) that are programmably interconnected to each other to provide logic functions desired by a user. The architecture of some FPGAs may be described as including "tiles", wherein each tile includes a CLB as well as a portion of an interconnect structure. "The 1998 Programmable Logic Data Book", pages 4–225 to 4–241, published by Xilinx, Inc. of San Jose, Calif., describes such a tile architecture as provided in the XC5200™ FPGA family, and is incorporated by reference herein.

To increase the complexity and size of the logic functions provided by an FPGA, the number of CLBs can be increased. However, this increase in CLBs then requires proportionately more interconnect structure. A common way of providing more interconnect structure is to add more wiring. Unfortunately, adding wiring significantly decreases silicon efficiency because each tile must provide worst case (i.e. maximum) interconnect resources, thereby making each tile larger and more complex. This increase in size and complexity at the tile level in turn increases the size, complexity, and ultimately cost of the FPGA.

One way of overcoming these disadvantages is to divide the tiles of the FPGA into a plurality of arrays (also called subarrays herein) and provide added routing channels between the arrays to interconnect the arrays. An FPGA architecture having a plurality of arrays of tiles is referred to herein as a window pane architecture because it resembles a large glass window divided into a plurality of smaller window panes. U.S. Pat. No. 5,455,525, issued to Ho et al. on Oct. 3, 1995, discloses such an architecture. In addition, Lucent sells an Optimized Reconfigurable Cell Array (ORCA) FPGA which has a window pane architecture.

FIG. 1 illustrates an FPGA 10 having a window pane architecture including four arrays 12. In this embodiment, each array 12 includes a 7×7 array of tiles 15. Vertical and horizontal routing channels 14 are provided between arrays 12. The wiring in routing channels 14, which extends the full length of the FPGA, provides hierarchial routing in FPGA 10. Specifically, the wiring included in routing channels 14 (also called long lines) is coupled to other interconnect and CLBs (neither shown) in tiles 15 located adjacent routing channels 14. Therefore, such long lines can become heavily loaded with multiple potential connections to numerous tiles and thus become incapable of driving all connections to proper levels without buffers. Furthermore, such long lines are inherently highly capacitive and thus slow, thereby causing timing problems which can be critical to overall FPGA performance.

Therefore, a need arises for a window pane architecture which overcomes the noted deficiencies of the prior art.

SUMMARY OF THE INVENTION

The present invention is incorporated into a programmable logic device having a window pane configuration, i.e. a large number of configurable logic block tiles divided into a plurality of arrays with routing channels between the arrays. In accordance with the present invention, segmenting and staggering routing wires in these routing channels significantly reduces excess loading and the need for buffers compared to prior art longline resources. Specifically, segmenting and staggering of the routing wires ensure effective connectivity in the programmable logic device, while substantially eliminating the longline capacitive-induced time delay of the prior art. Thus, the present invention allows use of window pane architectures for large arrays and provides significant advantages over the prior art.

In one embodiment of the present invention, each routing wire occupies a track in the routing channel and is coupled to respective configurable logic block tiles in each adjacent array identically. In other embodiments, at least one routing wire occupies a plurality of tracks in the routing channel but is still coupled to respective configurable logic block tiles in each adjacent array identically.

Various connection-related improvements may also be made in the present invention. In one such improvement, a switch matrix normally used within each tile for internal routing is also used in the routing channel to selectively route signals between the routing wires and the configurable logic block tiles. Programmable interconnect points are employed in another such improvement to facilitate interconnection between the routing wires in the channel and selected configurable logic block tiles.

DETAILED DESCRIPTION OF THE DRAWINGS

Figure 1:
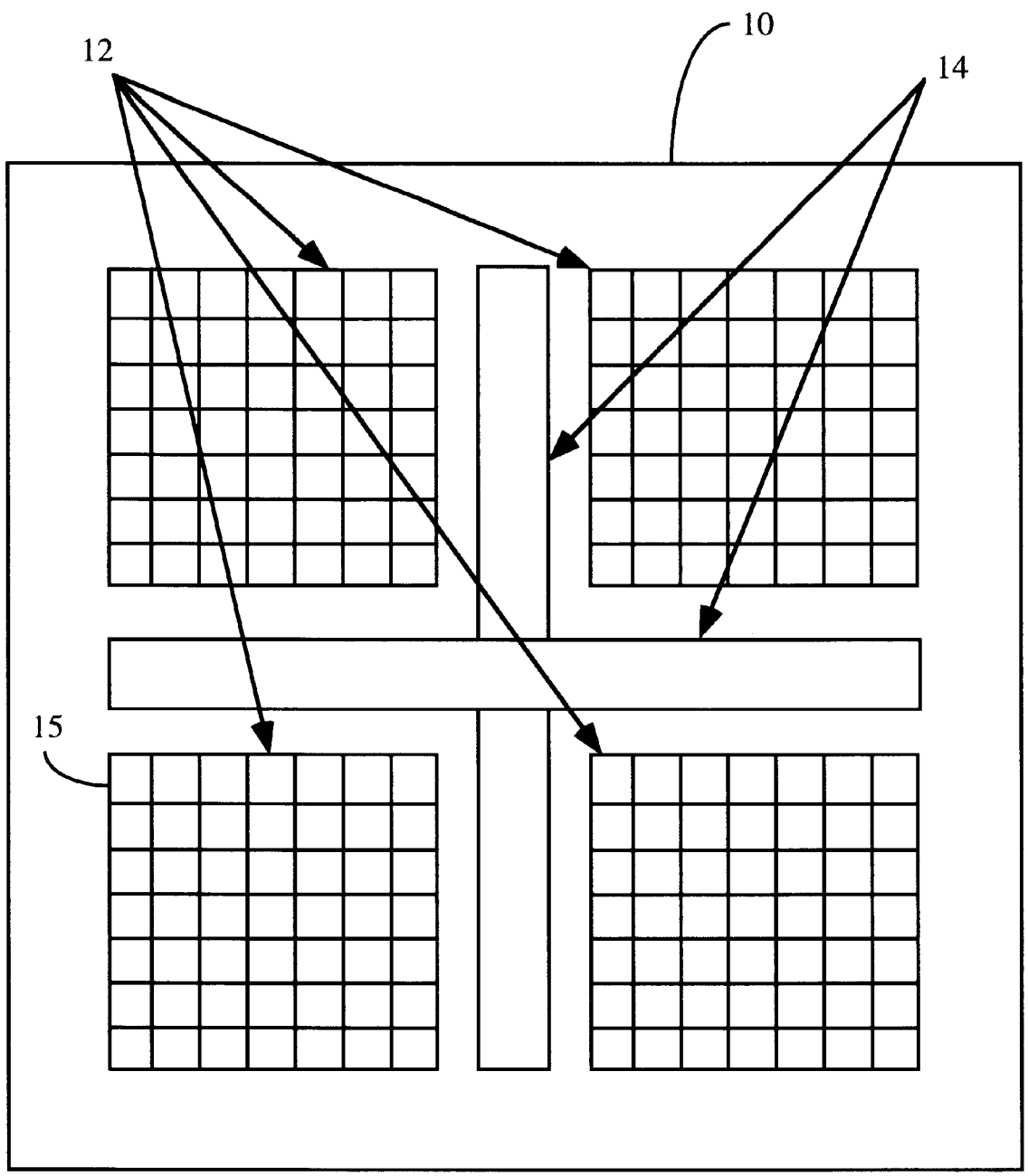
FIG. 1 illustrates an FPGA having a window pane architecture.
Figure 2:
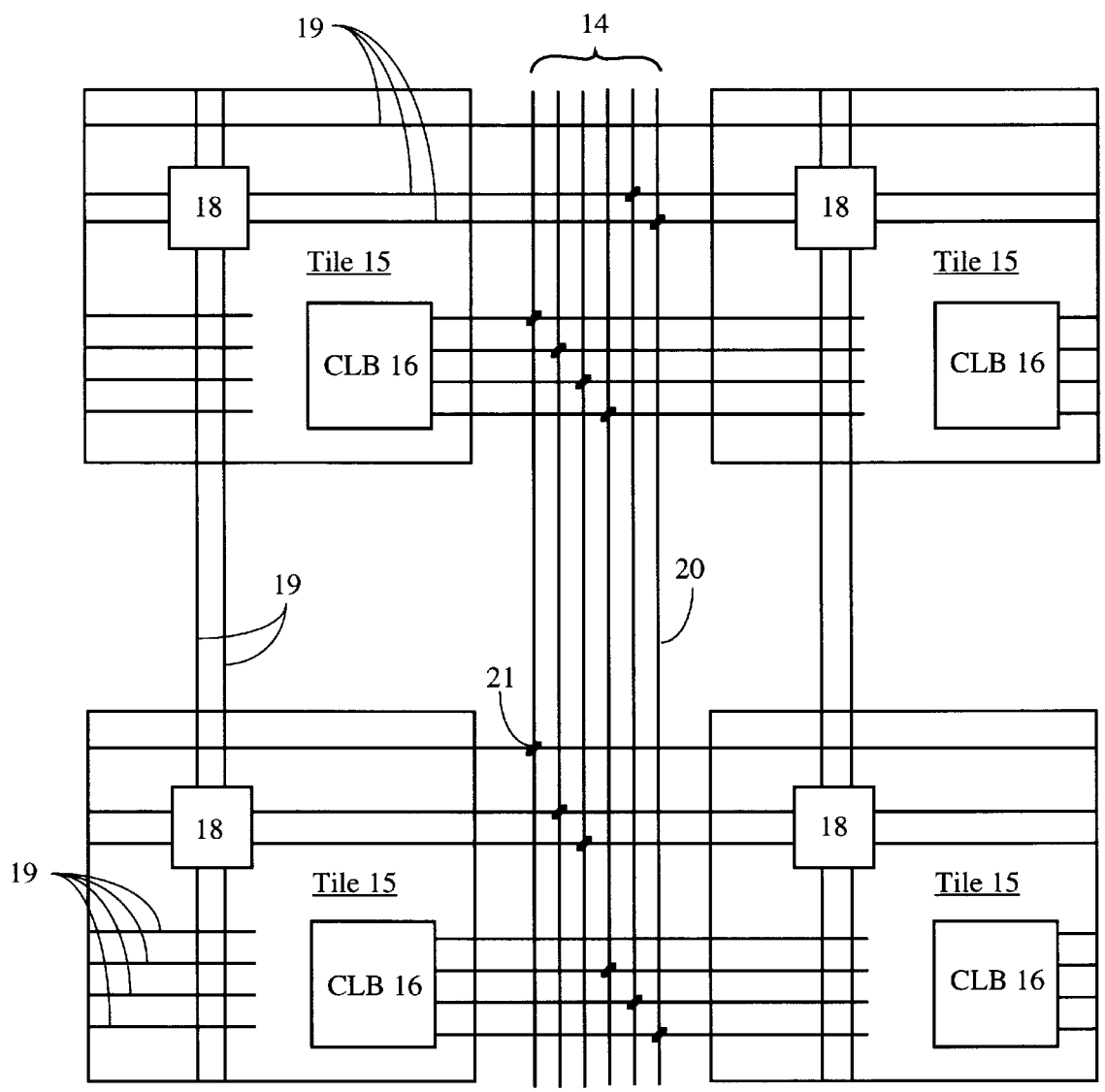
FIG. 2 shows four configurable logic block tiles of the FPGA of FIG. 1 with a vertical routing channel.

FIG. 2 illustrates four tiles 15 of FPGA 10 (FIG. 1) adjacent to a vertical routing channel 14. Note that each tile 15 includes a CLB 16, a switch matrix 18, and interconnect 19. In one embodiment, CLB 16 includes a look-up table which may implement any arbitrarily defined Boolean function of its input signals. Switch matrix 18 is a switching device which can switch any of a plurality of inputs to any of a plurality of outputs. A more detailed description of switch matrix 18 is provided in the incorporated pages of "The 1998 Programmable Logic Data Book".

Vertical routing channel 14 includes a plurality of long lines 20. As shown in FIG. 2, programmable interconnect points (PIPs) 21 may connect a long line 20 to a switch matrix 18 as well as to a CLB 16 via interconnect 19. In one embodiment, each PIP 21 is a transistor switch controlled by its respective memory cell, the logic state of which determines the open or closed condition of the switch. PIPs are discussed in detail in U.S. Reissue Pat. No. 34,364, reissued to Freeman on Aug. 31, 1993, which is also incorporated by reference herein. Note that long lines in a horizontal routing channel (not shown) may be coupled to tiles 15 in a similar manner.

Figure 3:
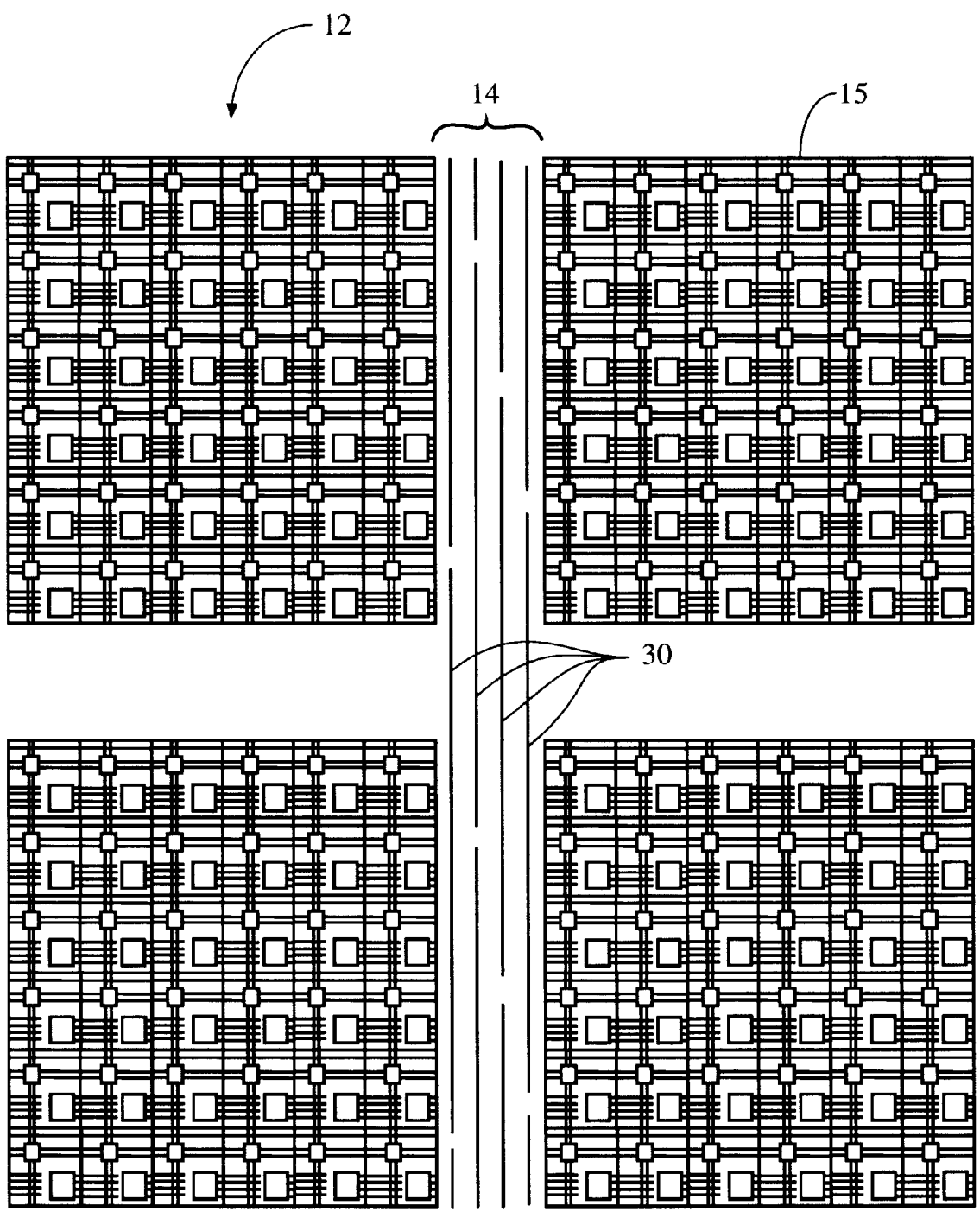
FIG. 3 illustrates a 12×12 tile array divided into four subarrays and having a vertical channel with both segmented and staggered wiring in accordance with the present invention.

In accordance with the present invention as shown in FIG. 3, routing channel 14 includes a plurality of routing wires 30, at least some of which are segmented and staggered. The segmenting of the present invention eliminates the loading and delay problems associated with the long lines of the prior art, whereas the staggering facilitates more efficient interconnection by assuring the availability of at least one wire interconnection at every possible tile along the entire subarray edge. For purposes of this disclosure, the term "segmented" means a non-concatenated routing wire which does not extend the full length of routing channel 14 and the term "staggered" means a plurality of segmented routing wires which are interrupted at different locations so that segments begin and end adjacent different tiles 15.

In one embodiment, the routing wires extend over at least the length of four adjacent tiles 15. In other embodiments, the routing wires extend over more or less tiles. In yet other embodiments, the routing wires have different lengths (one routing wire being a different length than another routing wire). In any case, the routing wires in routing channels 14 typically include lengths greater than one tile edge length. Otherwise, a shorter connection would only couple tiles in the same subarray 12 and that connection can be made with an internal connection.

Figure 4:
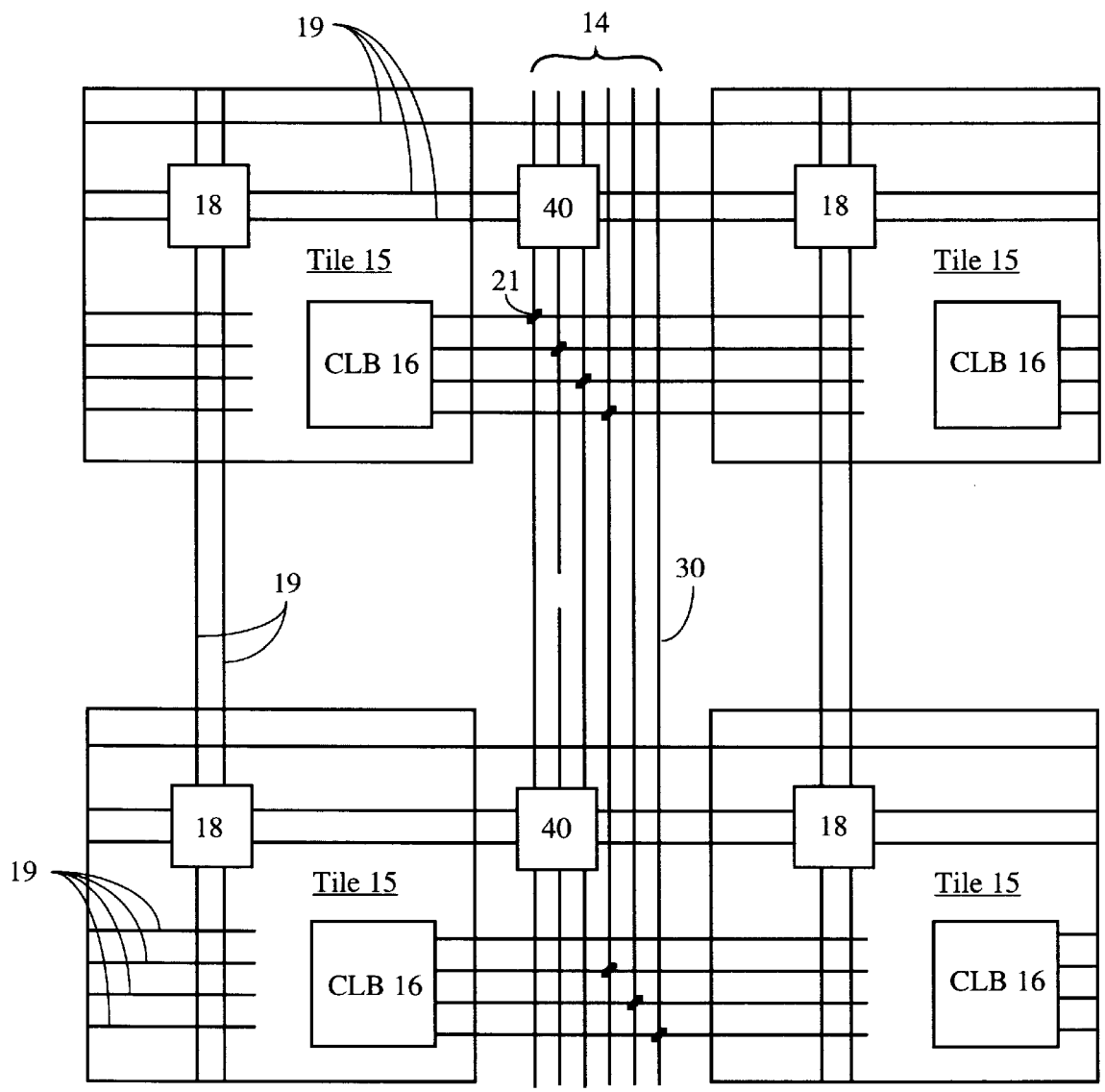
FIG. 4 illustrates certain CLB to wiring interconnection improvements in accordance with one embodiment of the present invention.

Note that in FIG. 3, the interconnection between tiles 15 and routing wires 30 is omitted for purposes of clarity. As shown in FIG. 4, PIPs 21 may be used to implement such interconnections. If more interconnection flexibility between a tile 15 and routing wires 30 is desired than can be provided by PIPs 21, then additional switch matrices 40 may be located in appropriate locations in routing channel 14 (only one location illustrated in FIG. 4).

Figure 5:
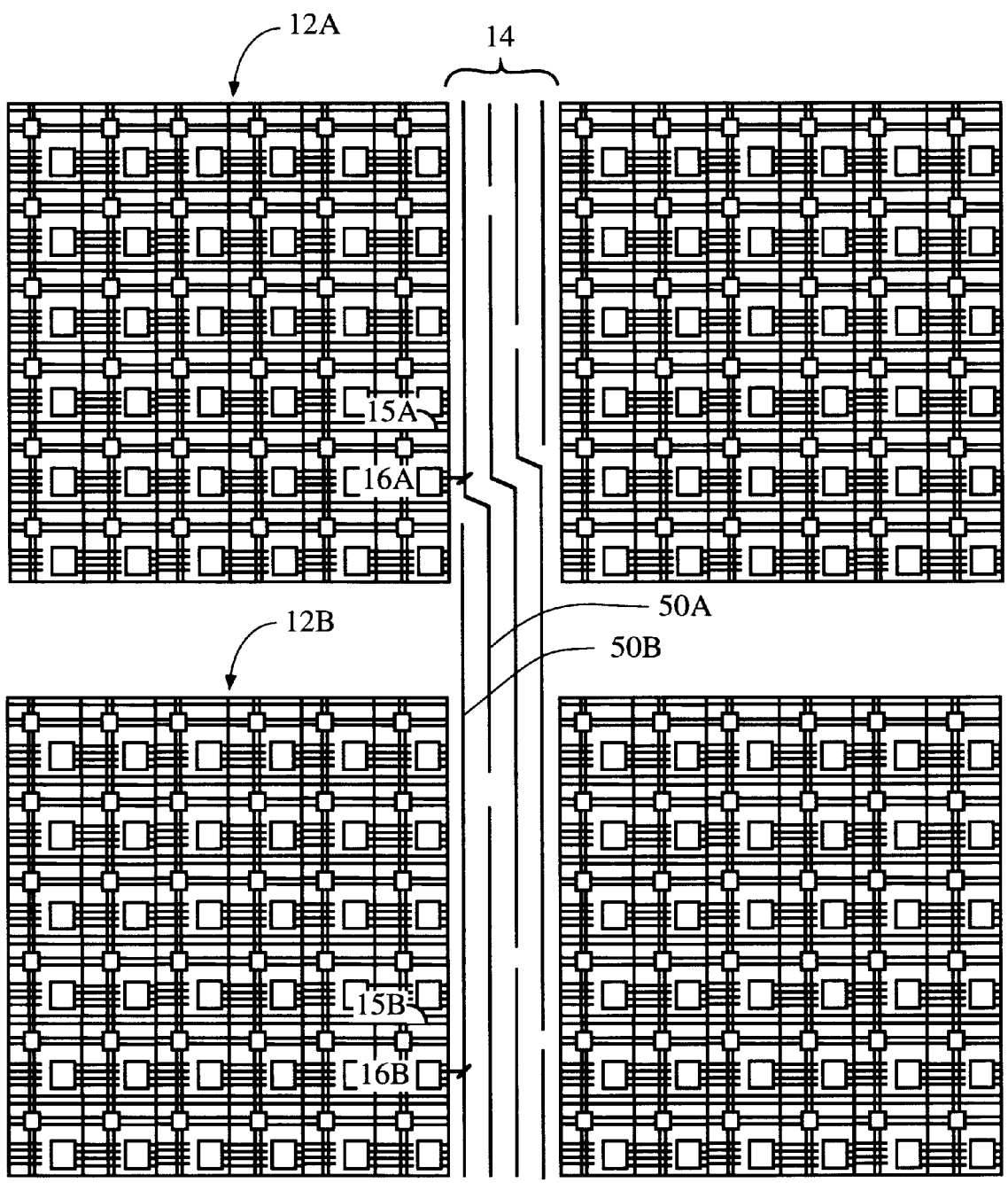
FIG. 5 shows a plurality of routing wires which occupy multiple tracks in the routing channel.

In one embodiment of the present invention, each segmented routing wire occupies a track in the channel, wherein the segmented wire in a specific track is coupled to respective tiles in each adjacent subarray identically. Note that if at least one segmented routing wire occupies a plurality of tracks in the channel, then in those embodiments the segmented wires in a specific track are coupled to respective tiles in each adjacent subarray identically. For example as shown in FIG. 5, channel 14 includes four tracks and segmented wire 50A occupies parts of two tracks of routing channel 14. However, the segmented wires in the left-hand track are coupled to respective tiles 15 in subarrays 12 in a similar manner. Specifically, segmented wire 50A is programmably coupled to CLB 16A of tile 15A in subarray 12A in the same manner that segmented wire 50B is programmably coupled to CLB 16B of tile 15B in subarray 12B.

Figure 6:
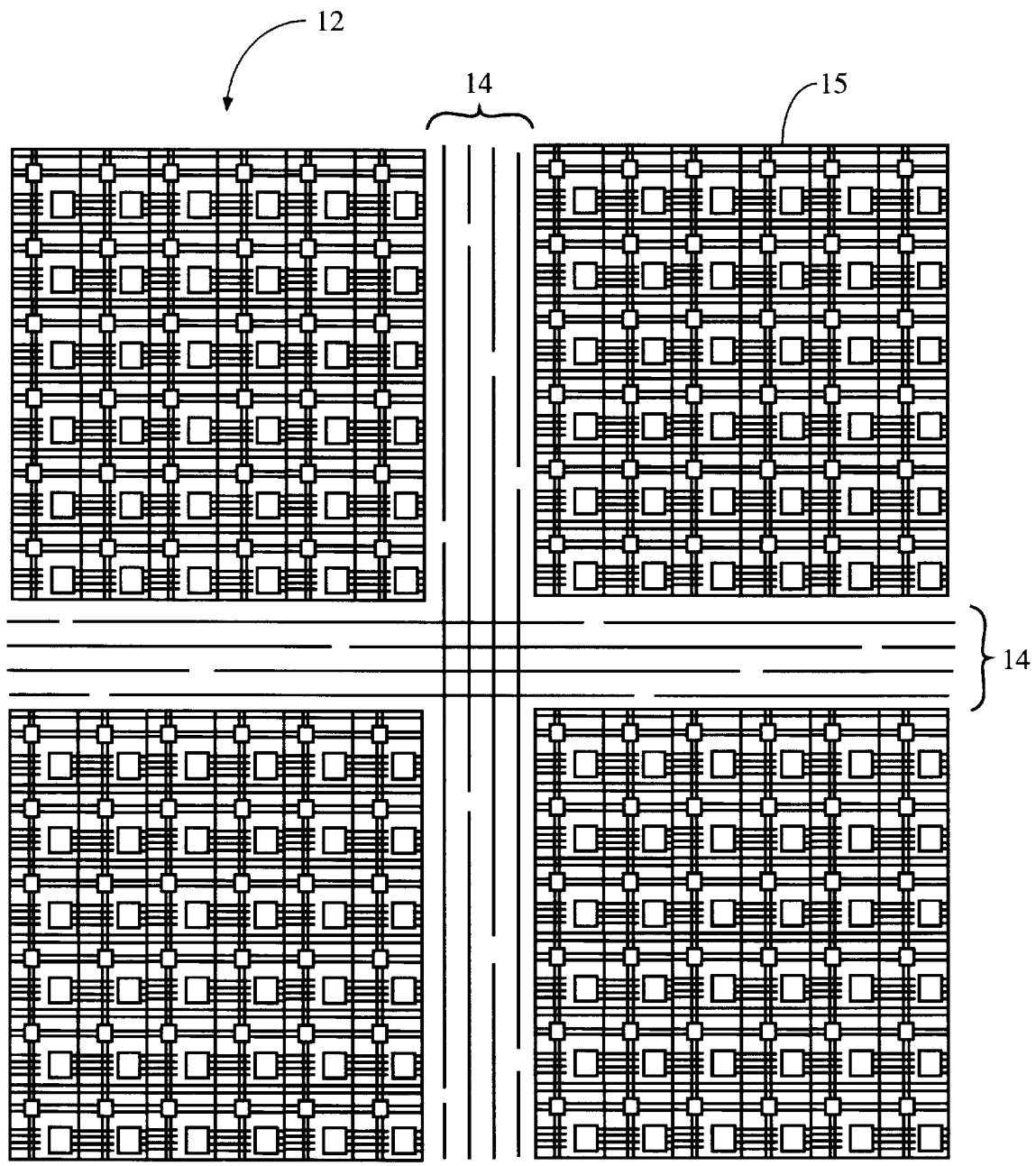
FIG. 6 shows segmented and staggered wiring in both vertical and horizontal channels.
Figure 7:
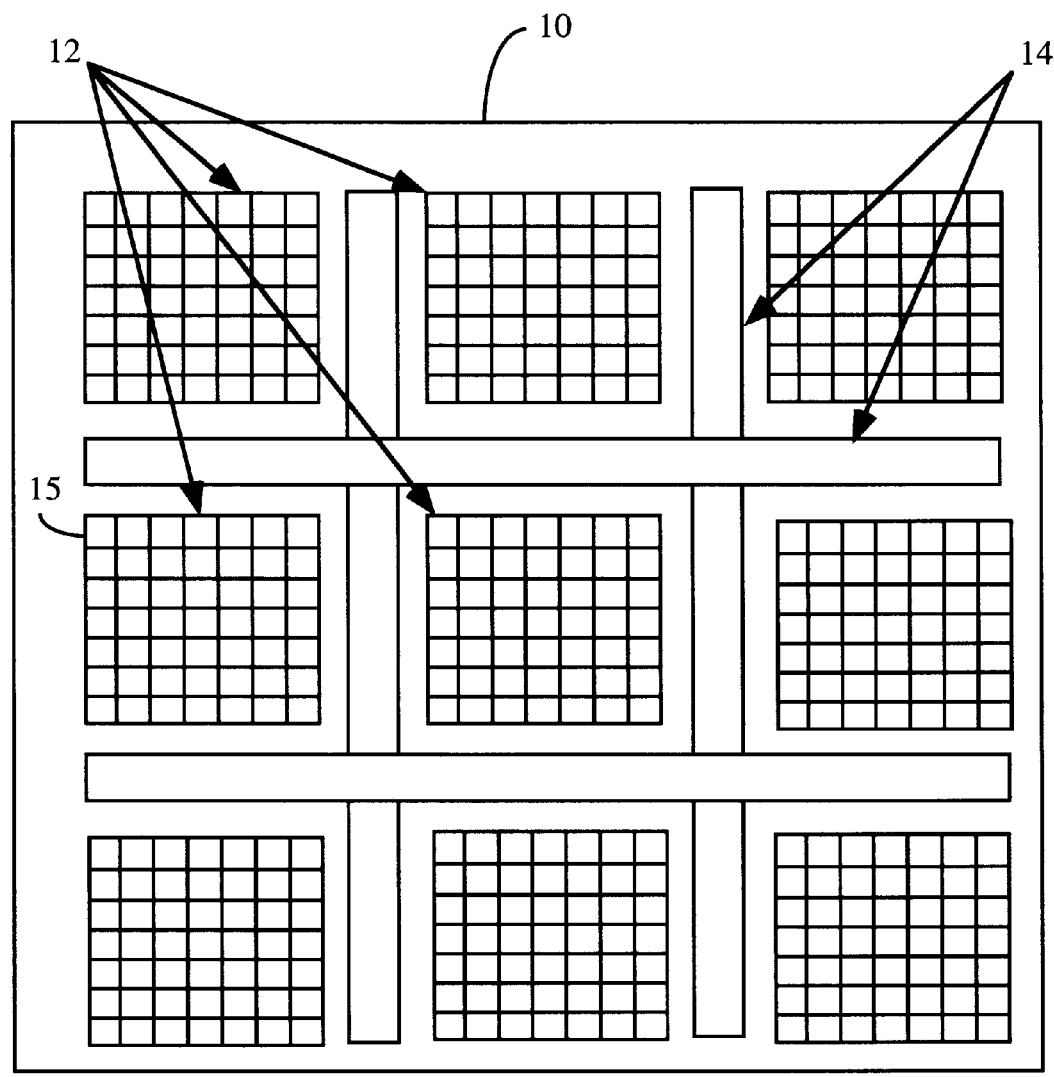
FIG. 7 illustrates an FPGA having a 3×3 subarray window pane architecture.

In accordance with the present invention, segmented routing may be provided in any channel 14 which separates subarrays 12. For example, FIG. 6 illustrates the use of segmented and staggered routing in both the vertical and horizontal channels 14 of a four subarray window pane architecture. It will be understood that while the present invention is disclosed herein as comprising a 2×2 array of subarrays, other numbers of subarrays are contemplated as well. By way of example, FIG. 7 illustrates a 3×3 array of CLB subarrays with which the invention can be readily implemented.

Figure 8A:
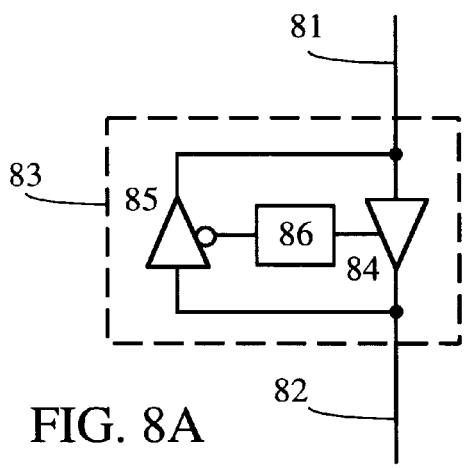
FIGS. 8A and 8B show structures for concatenating the routing wires of the present invention.

In accordance with the present invention, at least one channel may include some segmented routing lines which are concatenated and buffered. FIG. 8A illustrates two segmented routing lines 81 and 82 which are concatenated via circuit 83. In this embodiment which provides bi-directional transfer of a signal, circuit 83 includes two buffers 84 and 85 controlled by a memory cell 86. Other circuits for concatenating and buffering may be used in the present invention, including without limitation the three-state bidirectional buffer circuit described in U.S. Pat. No. 4,835,418, which is incorporated by reference herein. Note that even if less than, for example, four tiles are traversed (with associated PIP coupling), the buffering of the signal on a segmented routing line may result in a faster signal path than if non-segmented lines, such as those found in the prior art, were used. Thus, the present invention of segmented routing lines, even if concatenated, may still increase performance compared to the non-segmented routing lines of the prior art.

Figure 8B:
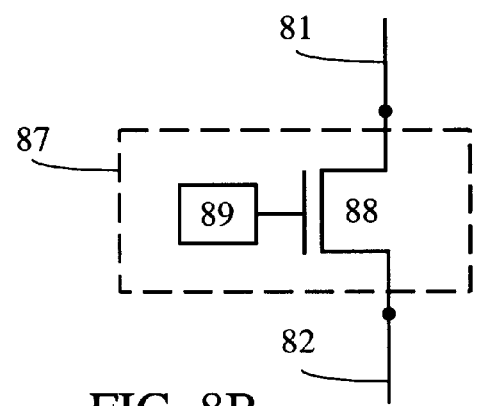

Note that concatenating some segmented lines may be done without buffering. FIG. 8B shows two segmented routing lines 81 and 82 which are concatenated via a programmable interconnect point 87 (in this embodiment, a transistor 88 controlled by a memory cell 89).

In the prior art, signal transfer between subarrays is critical. Therefore, the use of non-segmented lines would be particularly well suited for this function. In contrast, the present invention of segmented lines provides the flexibility of interconnecting tiles within one subarray.

In the present invention, the speed and size of an FPGA implemented in a window pane architecture are significantly improved compared to the prior art. Segmented wires allow multiple signals to share a track in a channel. Further, segmented wires allow a signal to propagate faster because each signal drives a shorter wire. Finally, staggered segments ensure that at any tile location, there exists a segment reaching an appropriate distance in the channel, thereby significantly simplifying the job of placing logic into CLBs in the tiles.

Those having skill in the art of FPGA routing, having gained the benefit of the foregoing disclosure, will now perceive modifications and additions which may be made to the invention. Accordingly, it will be understood that such modifications and additions are deemed to be within the scope of the invention which is limited only by the appended claims and their equivalents.

What is claimed is:

1. A programmable logic device comprising:
   a plurality of subarrays, each subarray including a plurality of configurable logic block (CLB) tiles, each CLB tile including a CLB, programmable interconnect, and a CLB switch matrix for interconnecting the programmable interconnect of multiple CLB tiles; and
   at least one routing channel between said subarrays, said routing channel including a plurality of non-concatenated, segmented routing wires positioned parallel to the length of said routing channel, wherein at least some of said routing wires are staggered, and wherein the CLBs adjacent said routing channel are coupled directly to at least one routing wire and the CLBs non-adjacent said routing channel are coupled to at least one routing wire via said programmable interconnect and said CLB switch matrices.

2. The programmable logic device of claim 1 wherein at least one CLB tile is coupled to at least one routing wire by a routing channel switch matrix.

3. The programmable logic device of claim 1 wherein each routing wire occupies a track in said at least one routing channel, wherein the routing wire in a specific track is coupled to respective CLB tiles in each adjacent subarray identically.

4. The programmable logic device of claim 1 wherein at least one routing wire occupies a plurality of tracks in said at least one routing channel, wherein the routing wires in a specific track are coupled to respective CLB tiles in each adjacent subarray identically.

5. A programmable logic device comprising:
- at least two arrays of configurable logic block (CLB) tiles, wherein each CLB tile includes a CLB, programmable interconnect, and a CLB switch matrix for interconnecting the programmable interconnect of multiple CLB tiles;
- a routing channel provided between said at least two arrays; and
- a plurality of non-concatenated, segmented routing wires in said routing channel, wherein at least some of said routing wires are staggered, wherein the CLBs adjacent said routing channel are coupled directly to at least one routing wire and the CLBs non-adjacent said routing channel are coupled to at least one routing wire via said programmable interconnect and said CLB switch matrices, and wherein at least one CLB tile in one array is coupled to at least one CLB tile in another array by at least one of said routing wires.

6. The programmable logic device of claim 5 wherein at least some of said CLB tiles are coupled to said routing wires by at least one routing channel switch matrix.

7. The programmable logic device of claim 5 wherein the respective CLBs of two CLB tiles on respective arrays have their respective CLBs coupled via said routing channel.

8. The programmable logic device of claim 5 wherein each routing wire occupies a track in said routing channel, wherein the routing wire in a specific track is coupled to respective CLB tiles in each adjacent array identically.

9. The programmable logic device of claim 5 wherein at least one routing wire occupies a plurality of tracks in said channel, wherein the routing wires in a specific track are coupled to respective CLB tiles in each adjacent array identically.

10. An FPGA comprising:
- a window pane architecture having a plurality of the subarrays separated from each other to provide longitudinal spaces between respective subarrays, wherein each subarray includes a plurality of tiles and each tile includes a CLB, programmable interconnect, and a CLB switch matrix for interconnecting the programmable interconnect of multiple tiles;
- a routing channel in each of said spaces, each routing channel having a plurality of non-concatenated, segmented routing lines in said routing channel, wherein the CLBs adjacent said routing channel are coupled directly to at least one routing line and the CLBs non-adjacent said routing channel are coupled to at least one routing line via said programmable interconnect and said CLB switch matrices, wherein at least some of said routing wires are staggered, wherein said routing lines interconnect said tiles in respective subarrays; and
- at least one programmable interconnect point on at least one of said segmented routing lines for selectively coupling at least one of said tiles to said one of said routing lines.

* * * * *